United States Patent
Hart et al.

(10) Patent No.: US 7,966,722 B2
(45) Date of Patent: Jun. 28, 2011

(54) PLANARIZATION METHOD IN THE FABRICATION OF A CIRCUIT

(75) Inventors: David Hart, Cornelius, OR (US); David McDonald, Hillsboro, OR (US); Guillaume Bouche, Beaverton, OR (US); Sudarsan Uppili, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 381 days.

(21) Appl. No.: 12/172,079

(22) Filed: Jul. 11, 2008

(65) Prior Publication Data

US 2010/0005654 A1    Jan. 14, 2010

(51) Int. Cl.
    *H05K 3/02* (2006.01)
(52) U.S. Cl. ............... 29/847; 29/832; 29/831; 29/852; 29/846; 29/25.35
(58) Field of Classification Search ............ 29/847, 29/846, 852, 831, 832, 830, 25.35; 257/288, 257/758, 67, 69; 438/197, 778, 622, 632, 438/680, 239; 333/187, 133, 189, 188
See application file for complete search history.

(56) References Cited

U.S. PATENT DOCUMENTS

| | | | |
|---|---|---|---|
| 5,925,932 A * | 7/1999 | Tran et al. | 257/750 |
| 6,097,090 A * | 8/2000 | Tran et al. | 257/750 |
| 6,542,054 B2 | 4/2003 | Aigner et al. | |
| 7,230,509 B2 * | 6/2007 | Stoemmer | 333/133 |
| 7,372,346 B2 * | 5/2008 | Tilmans et al. | 333/187 |
| 2007/0266548 A1 | 11/2007 | Fattinger | |

* cited by examiner

Primary Examiner — Derris H Banks
Assistant Examiner — Tai Nguyen
(74) Attorney, Agent, or Firm — Blakely Sokoloff Taylor & Zafman LLP

(57) ABSTRACT

Planarization methods for maintaining planar surfaces in the fabrication of such devices as BAW devices and capacitors on a planar or planarized substrate are described. In accordance with the method, a metal layer is deposited and patterned, and an oxide layer is deposited using a high density plasma chemical vapor deposition (HDP CVD) process to a thickness equal to the thickness of the metal layer. The HDP CVD process provides an oxide layer on the patterned metal tapering upward from the edge of the patterned metal layer. Then, after masking and etching the oxide layer from the patterned metal layer, the patterned metal layer and surrounding oxide layer form a substantially planar layer, interrupted by small remaining oxide protrusions at the edges of the patterned layer. These small remaining oxide protrusions may be too small to significantly disturb the flatness of a further oxide or other layer or they may be further mitigated by the application of another HDP CVD oxide film.

8 Claims, 6 Drawing Sheets j. Complete the coupled resonator filter with the top resonator 2 structures.

a. acoustic mirror b. acoustic mirror c. acoustic mirror d. acoustic mirror

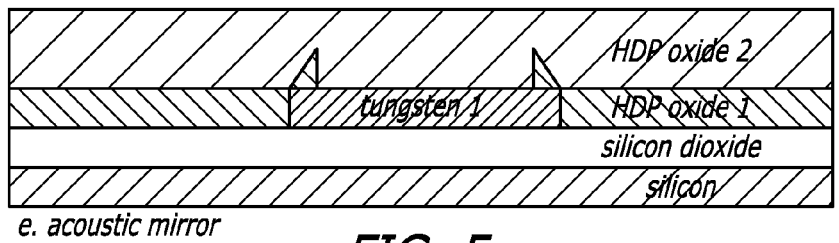

e. acoustic mirror

FIG. 5

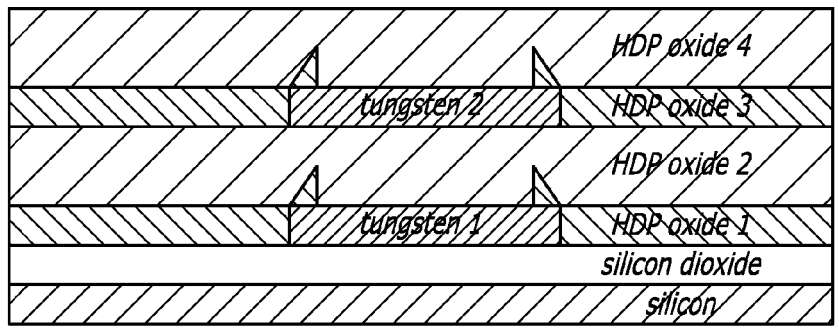

f. Repeat steps a. through e. for each layer of the Bragg acoustic mirror.

FIG. 6

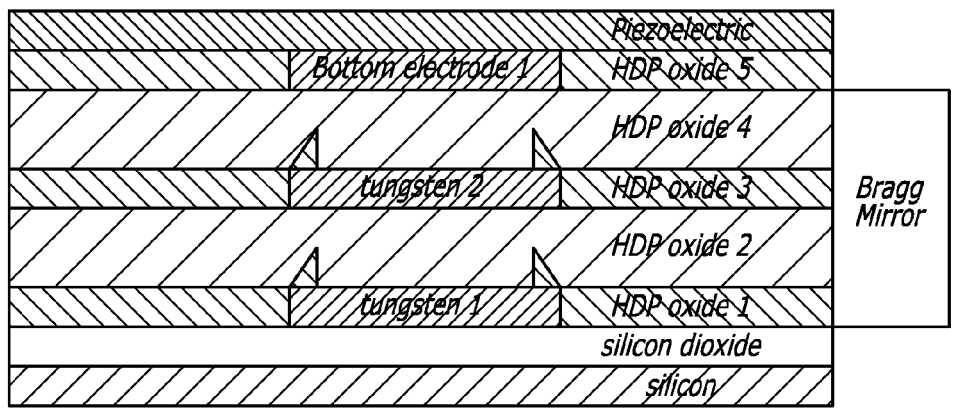

g. Begin with the Bragg acoustic mirror structure and continue to build the coupled resonator filter.
Planarization of the bottom electrode structures begins with steps a. though d. of the acoustic mirror planarization. From that point it deviates to a more complicated scheme due to special considerations required for the piezoelectric layer.

FIG. 7 h. Repeat steps a. through e. to planarize the top electrode 1 structure.

i. Repeat steps a. through e. to planarize the decoupling layers.

*j. Complete the coupled resonator filter with the top resonator 2 structures.* a. capacitor b. capacitor c. capacitor d. capacitor e. capacitor f. capacitor

PLANARIZATION METHOD IN THE FABRICATION OF A CIRCUIT

BACKGROUND OF THE INVENTION

1. Field of the Invention

The present invention relates to the field of methods of maintaining planar layers in devices such as BAW (bulk acoustic wave) resonators, integrated capacitors and the like.

2. Prior Art

BAW (bulk acoustic wave) resonators are used to provide RF filters for wireless applications and reference oscillators. The acoustic mirror used in conjunction with a solidly mounted BAW resonator (SMR) consists of alternating layers having low and high acoustic impedance. The layer of high acoustic impedance, typically, but not limited to, a metal such as tungsten, is patterned over the layer of low acoustic impedance, typically, but not limited to, silicon dioxide. The topography resulting from the patterning is reduced through the application of another layer of the low acoustic impedance film which is then further processed to remove that portion of the film on top of the patterned high acoustic impedance layer, W. The thicknesses of the layers and placement of the mirror between the supporting substrate and the active BAW resonator is controlled such that energy from the desired acoustic waves generated in the resonator is reflected back into the device.

Prior art uses chemical mechanical polishing (CMP) (see U.S. Pat. No. 6,542,054) or an etch-back method (see U.S. Patent Application Publication No. US 2007/0266548) to reduce the topography associated with the patterning of the high acoustic impedance layer and application of the sacrificial upper layer of low acoustic impedance material. CMP processes are expensive and suffer from "dishing" defects that reduce the overall planarity of the final structure and may result in the propagation of undesirable acoustic modes in the device. The etch-back method struggles with the control of the size and shape of pits in the defect region formed at the edges of the patterned high acoustic impedance layer. These pits must be mitigated in subsequent process steps. The etch-back method also relies on the use of an etch-stop layer deposited beneath the high acoustic impedance layer to prevent etching of the low acoustic impedance material any deeper than the bottom plane of the high acoustic impedance layer.

BRIEF DESCRIPTION OF THE DRAWINGS

FIGS. 1 through 8 are generally illustrative of the fabrication of an exemplary BAW resonator in accordance with a preferred embodiment of the invention.

DETAILED DESCRIPTION OF THE PREFERRED EMBODIMENTS

As previously mentioned in the prior art section, the acoustic mirror used in conjunction with a solidly mounted BAW resonator (SMR) consists of alternating layers having low and high acoustic impedance. The layer of high acoustic impedance, typically, but not limited to, a metal such as tungsten, is patterned over the layer of low acoustic impedance, typically, but not limited to, silicon dioxide. The topography resulting from the patterning is reduced through the application of another layer of the low acoustic impedance film which is then further processed to remove that portion of the film on top of the patterned high acoustic impedance layer, W. The thicknesses of the layers and placement of the mirror between the supporting substrate and the active BAW resonator is controlled such that energy from the desired acoustic waves generated in the resonator is reflected back into the device. This invention addresses the problem of shape control of the acoustic mirror structure using a highly manufacturable and low cost method of planarization.

More particularly, an embodiment of the present invention uses a unique patterning and etching scheme for a sacrificial layer during the planarization of an acoustic mirror assembly for Bulk Acoustic Wave resonator devices. The present invention eliminates the need for CMP. It also eliminates the need for an etch-stop layer, and eliminates the defect pits formed by the etch-back method. The present invention controls the shape of the sacrificial low acoustic impedance layer near the edge of the patterned high acoustic impedance layer, the size of the opened area to be etched, and the isotropic etch process used to create the opening over the high impedance layer in a way that results in a nearly planar structure. The small bump of oxide remaining on the top edge of the tungsten layer is diminished by the application of a final planarizing layer of oxide using a high density plasma chemical vapor deposition process.

An embodiment of the present invention will be described for the planarization of a single bilayer structure of low and high acoustic impedance materials. In this case the materials used are silicon dioxide for the low acoustic impedance material and tungsten for the high acoustic impedance material, though other materials may be used for the high acoustic impedance material, such as, by way of example, $TiW/SiO_2$, $Pt/SiO_2$ and $Al/SiO_2$. The same planarization method can be used if multiple bilayers are deposited in sequence and patterned with a single photolithography step.

Figure 1:
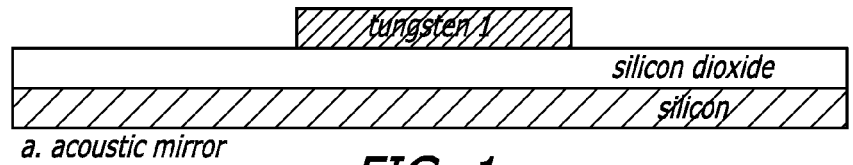
Figure 2:
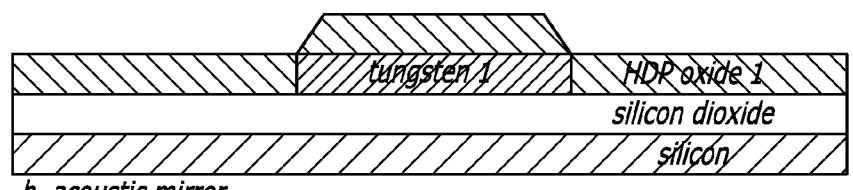

A silicon dioxide layer of the appropriate thickness for the initial low acoustic impedance layer of the mirror is deposited on a planar or planarized surface of a substrate material, typically a silicon substrate. The high acoustic impedance tungsten layer is then deposited over the oxide layer and patterned so that islands of tungsten reside on the initial oxide layer, as illustrated in FIG. 1. The next silicon dioxide layer deposited is partially sacrificed to planarize the topography created by the patterning of the tungsten. The oxide is applied using a standard high-density plasma chemical vapor deposition (HDP CVD) process to a thickness equal to the thickness of the patterned tungsten layer, as shown in FIG. 2. An HDP CVD process generally refers to the nature of the plasma in terms of pressure, electron density, and fractional ionization, and to the configuration of the processing equipment in terms of the radio frequency power sources and biasing electronics used to generate the plasma and to create a significant sputter etching component during the deposition. An HDP CVD oxide deposition is actually a process whereby the oxide is simultaneously deposited and etched. Thus, as used herein and in the claims to follow, a high-density plasma chemical vapor deposition (HDP CVD) process is defined as a process that allows the concurrent CVD deposition and sputter etching of a thin film. It is the combination of the deposition and etch that produces a characteristic coverage profile shown. By controlling the ratio of oxide deposition and etch rates, the shape of the sloped region of the deposited oxide can be controlled so that it self-aligns with the edge of the patterned tungsten layer, as illustrated in FIG. 2. HDP CVD deposition to etch ratios between 2 and 7 are typical.

The present invention may be practiced using commercially available equipment without modification.

Figure 3:
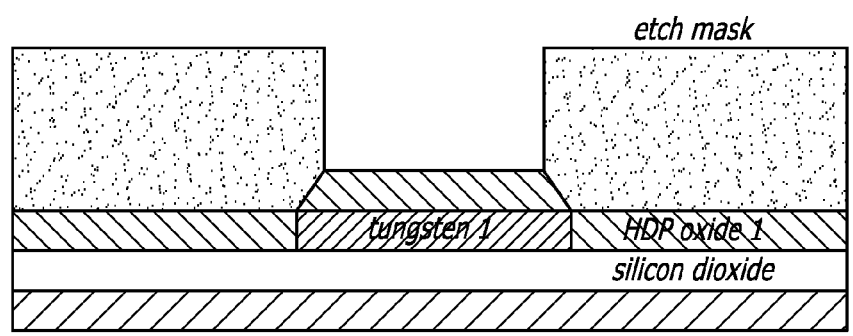
Figure 4:
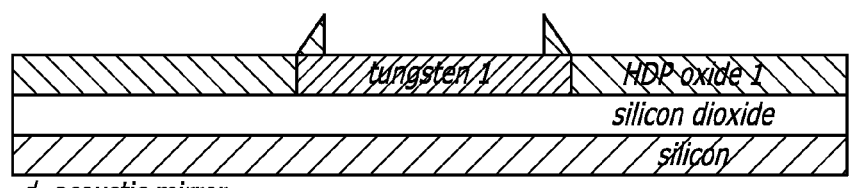
Figure 8:
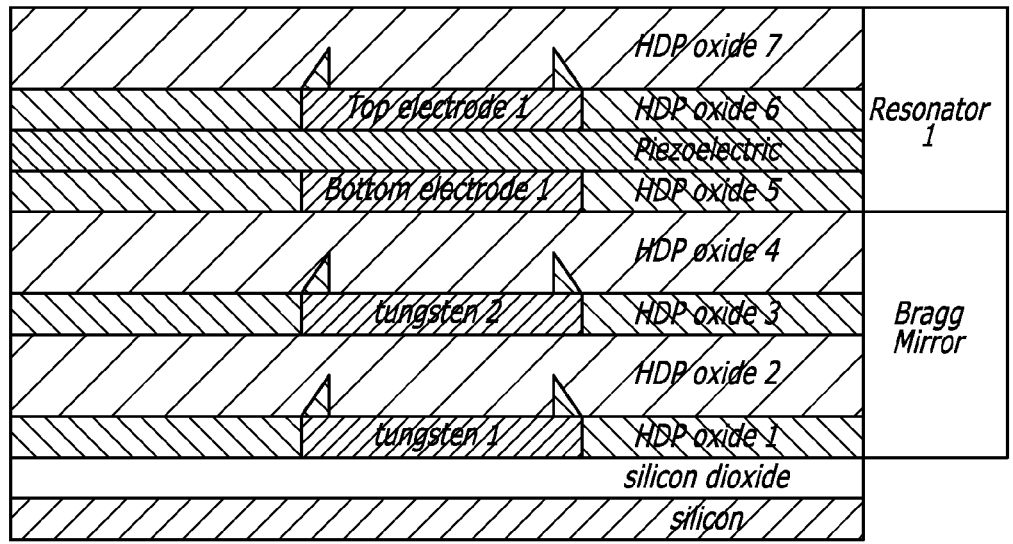

A photoresist mask is then applied so that the opening in the mask is on top of and smaller than the patterned tungsten layer, as illustrated in FIG. 3. The overlap of the mask with the patterned tungsten layer should be such that the sacrificial oxide layer can be etched isotropically to clear the oxide from the tungsten surface without having the lateral etch of the oxide extend beyond the edge of the patterned tungsten. In practice, the overlap of the photoresist mask with the patterned tungsten and the oxide etch time are chosen to provide sufficient process margin against too much lateral etch and results in a thin oxide bump at the extreme edge of the patterned tungsten layer as illustrated in FIG. 4. A final HDP CVD oxide layer is deposited over the mostly planar acoustic mirror bilayer. This HDP CVD oxide layer further mitigates the size of the bump at the edge of the patterned W layer, as illustrated in FIG. 5. The "final" HDP CVD oxide layer of FIG. 5 can be the actual final layer of the acoustic mirror, or it can be the initial layer of another acoustic mirror bilayer in which case the entire process would be repeated to maintain overall planarity of the stacked bilayers, as shown in FIG. 6.

In any event, after "the final" HDP CVD oxide layer of the acoustic mirror assembly, the bottom electrode is deposited and patterned, another HDP CVD oxide layer is deposited as before, again to the thickness of the bottom electrode, giving the topography of FIG. 2, and etched as in FIGS. 3 and 4. In the case of BAW resonator construction the planarization scheme deviates from the simplest form used for the acoustic mirror. To insure optimal performance of the piezoelectric film, final planarization is accomplished through chemical mechanical polishing before the deposition of the piezoelectric layer, as in FIG. 7. Then, typically, a top electrode is deposited and patterned, and a passivation layer is deposited.

Figure 9:
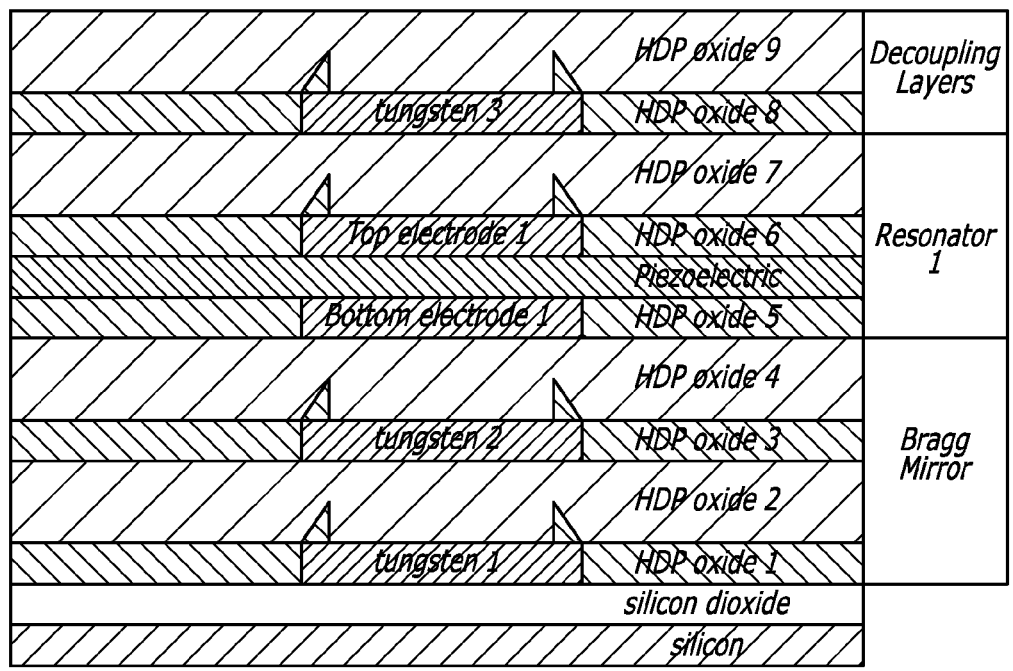
FIGS. 9 through 10 illustrate additional processing to fabricate a coupled BAW resonator.
Figure 10:
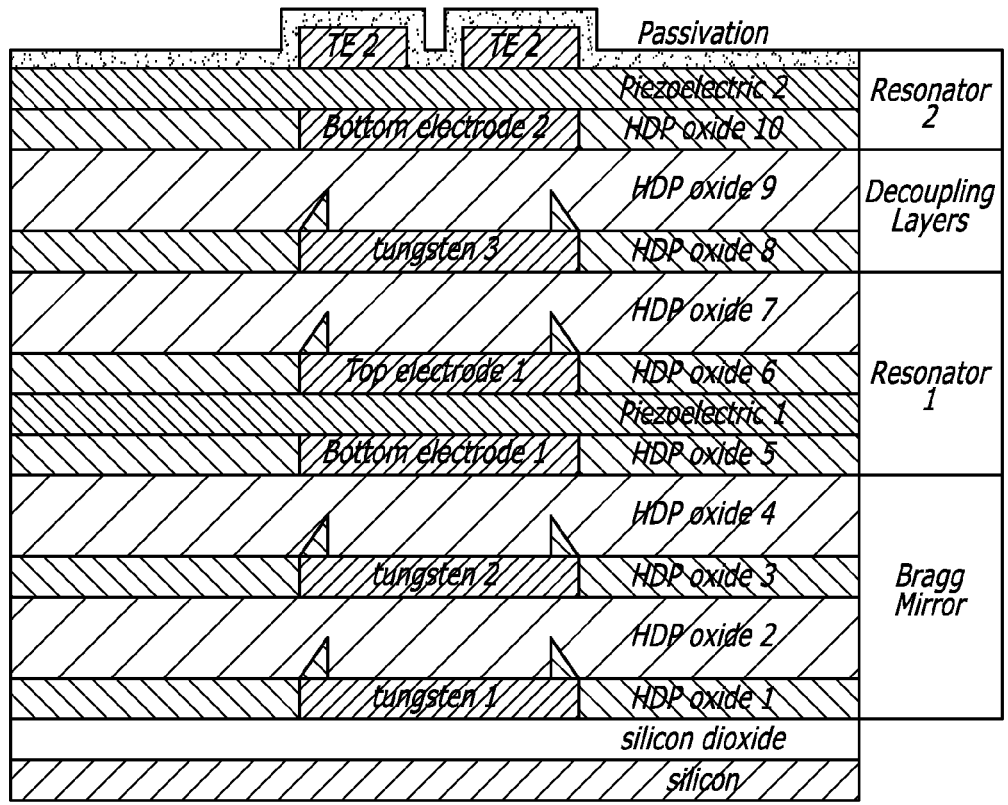
Figure 11:
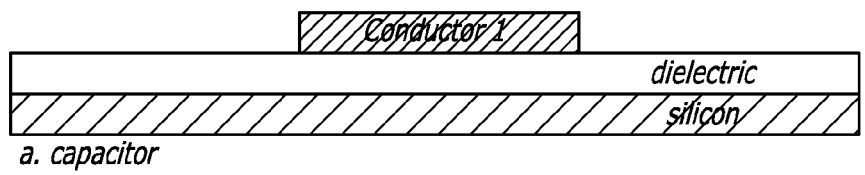
FIGS. 11 through 16 illustrate the fabrication of an exemplary capacitor in accordance with the present invention.
Figure 12:
Figure 13:
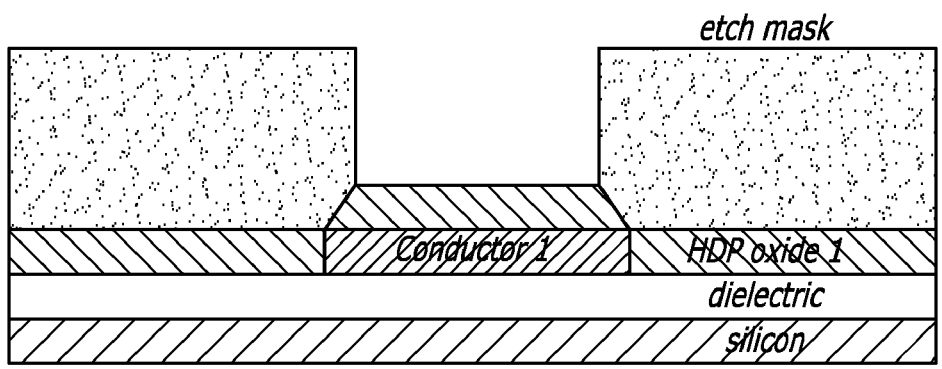
Figure 14:
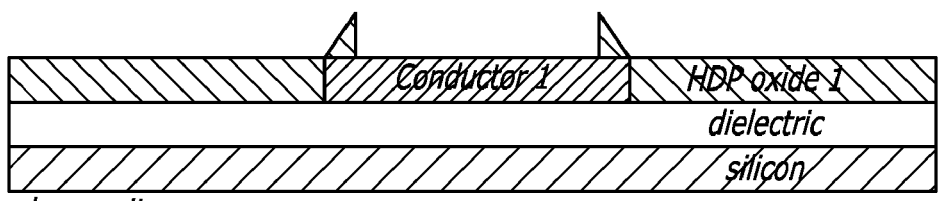
Figure 15:
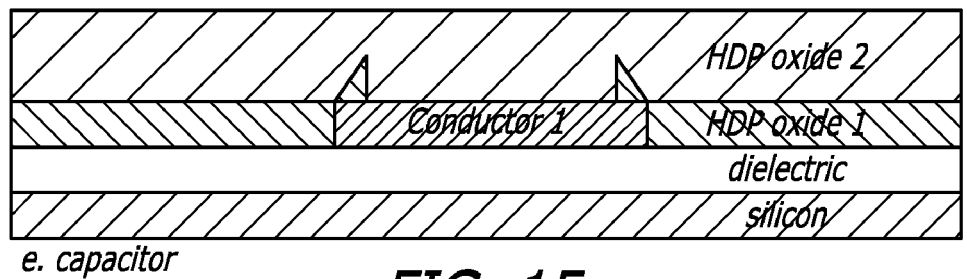

The present invention may also be used in the fabrication of coupled resonator filters. Instead of the passivation layer described above, another HDP CVD oxide layer is deposited, again to the thickness of the top electrode, with additional layers being deposited in accordance with the previously described methods, with the top electrodes TE2 and a passivation layer completing the coupled resonator, as shown in FIGS. 9 and 10.

Figure 16:
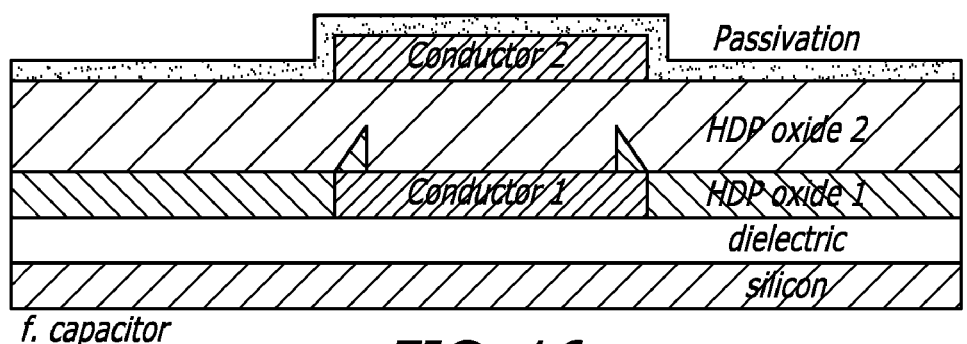

The present invention may be also used for fabrication of other devices wherein it is necessary or desired to maintain planar surfaces and layers. By way of example, in the case of integrated capacitors, nonplanar electrodes and/or insulator result in higher electric field gradients, potentially causing a breakdown, or alternatively, requiring the use of a thicker insulator for yield and reliability, thereby requiring a larger chip area for the desired capacitance. The fabrication of a capacitor in accordance with the present invention is illustrated in FIGS. 11 through 16. FIGS. 11 through 15 are identical to FIGS. 1 through 5, except for the fact that the patterned tungsten layer of FIG. 1 is simply a conductor layer in FIG. 11, which can be the same metal as the integrated circuit interconnect layers. In FIG. 16, the second conductor (capacitor plate) is deposited and patterned, with a final passivation layer over the capacitor.

The disclosure herein is exemplary of the devices readily fabricated using the present invention. Contacts to the electrodes of the devices illustrated have not been illustrated, though may be fabricated in a conventional manner. More complete device drawings would show top and bottom electrodes (or capacitor plates) with extensions away from the active areas to which contact would be made. In addition, the processing sequence allows for the formation of all planar interfaces before contact is established to the electrodes. Subsequent processing would create vias through the dielectric materials to allow contacts to the electrodes away from the active area of the device. Of course, there are no contacts to the acoustic mirror components.

Also the exemplary processes disclosed herein with respect to BAWs have been disclosed with respect to the use of tungsten (W) and silicon dioxide ($SiO_2$). However the methods of the present invention are also applicable to all metal/$SiO_2$ combinations that may be used for Bragg Mirrors, including but not limited to TiW/$SiO_2$, Pt/$SiO_2$ and Al/$SiO_2$, as well as various metals that may be used for capacitor plates or BAW electrodes.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. In the fabrication of a circuit, a method of maintaining a planar surface on an oxide layer deposited over a patterned layer of metal on a substrate comprising:
   depositing a dielectric layer on the substrate;
   depositing and patterning the metal layer on the dielectric layer;
   depositing a first oxide layer over the patterned layer of metal and the dielectric layer using high density plasma chemical vapor deposition (HDP CVD) to a thickness substantially equal to the thickness of the metal layer;
   applying a photoresist mask over the first oxide layer, the photoresist mask having an opening in the mask that is on top of and smaller than the patterned metal layer;
   etching the first oxide layer from the patterned metal layer such that a thin oxide bump is left at the edge of the patterned metal layer; and
   depositing a second HDP CVD oxide layer over the first oxide layer, the thin oxide bump, and the patterned metal layer such that the second HDP CVD oxide layer mitigates the size of the thin oxide bump.

2. The method of claim 1 wherein in photoresist mask is sized and positioned to prevent etching of the oxide layer adjacent the patterned metal layer.

3. The method of claim 2 further comprised of:
   depositing and patterning a second metal layer over the second HDP CVD oxide layer.

4. The method of claim 3 further comprised of:
   depositing a passivation layer over the second metal layer and the second HDP
   CVD oxide layer.

5. The method of claim 1 wherein the dielectric layer on the substrate is a silicon dioxide layer.

6. The method of claim 1 wherein the method is used in the fabrication of BAW resonator.

7. The method of claim 1 wherein the method is used in the fabrication of coupled BAW resonators.

8. In the fabrication of a circuit, a method of maintaining a planar surface on an oxide layer deposited over a patterned layer of metal on a substrate comprising:
   a) depositing the metal layer;
   b) patterning the metal layer;
   c) depositing an oxide layer over the patterned metal layer and surrounding substrate using high density plasma chemical vapor deposition to a thickness substantially equal to the thickness of the metal layer;

d) masking and etching the oxide layer from the patterned metal layer, the masking being sized and positioned to prevent etching of the oxide layer adjacent the patterned metal layer; and
e) depositing a second HDP CVD oxide layer over the patterned metal layer and surrounding oxide layer;
f) repeating a) through e) at least once;
g) then repeating a) through d);
h) chemical mechanical polishing the patterned metal and oxide layers of g), and;
i) depositing a piezoelectric layer.

* * * * *